July 7, 1970 | R. E. JOYNSON ET AL | 3,519,481

METHOD FOR FORMING THIN FILMS HAVING SUPERCONDUCTIVE CONTACTS

Filed Oct. 14, 1966

Inventors:
Reuben E. Joynson;
Constantine A. Neugebauer;
John R. Rairden, III., by John J. Kissane Their Attorney.

United States Patent Office 3,519,481
Patented July 7, 1970

3,519,481
METHOD FOR FORMING THIN FILMS HAVING SUPERCONDUCTIVE CONTACTS

Reuben E. Joynson and Constantine A. Neugebauer, Schenectady, and John R. Rairden III, Niskayuna, N.Y., assignors to General Electric Company, a corporation of New York Filed Oct. 14, 1966, Ser. No. 586,808
Int. Cl. H01v 11/02
U.S. Cl. 117—212 6 Claims

ABSTRACT OF THE DISCLOSURE

Superconductive contacts are formed on a thin film of niobium, tantalum and their alloys by the selective deposition of a superconductive contact metal atop the film within the chamber employed for the film deposition without breaching the vacuum of the chamber between depositions. Preferably metals forming a soft oxide layer, e.g. tin, are employed to form the contacts and the strain between the contacts and film desirably may be reduced by the selective deposition of an alloy of the contact metal and film metal in registration with the contact location prior to the deposition of only the contact metal thereon. Superconductive contacts also can be deposited atop an oxidized film of niobium, tantalum and their alloys by initially baking the film in vacuum to dissolve the surface oxide layer in the underlying metal and subsequently vacuum depositing the superconductive contacts atop the clean film surface.

Figures 1, 2, 3, 4:
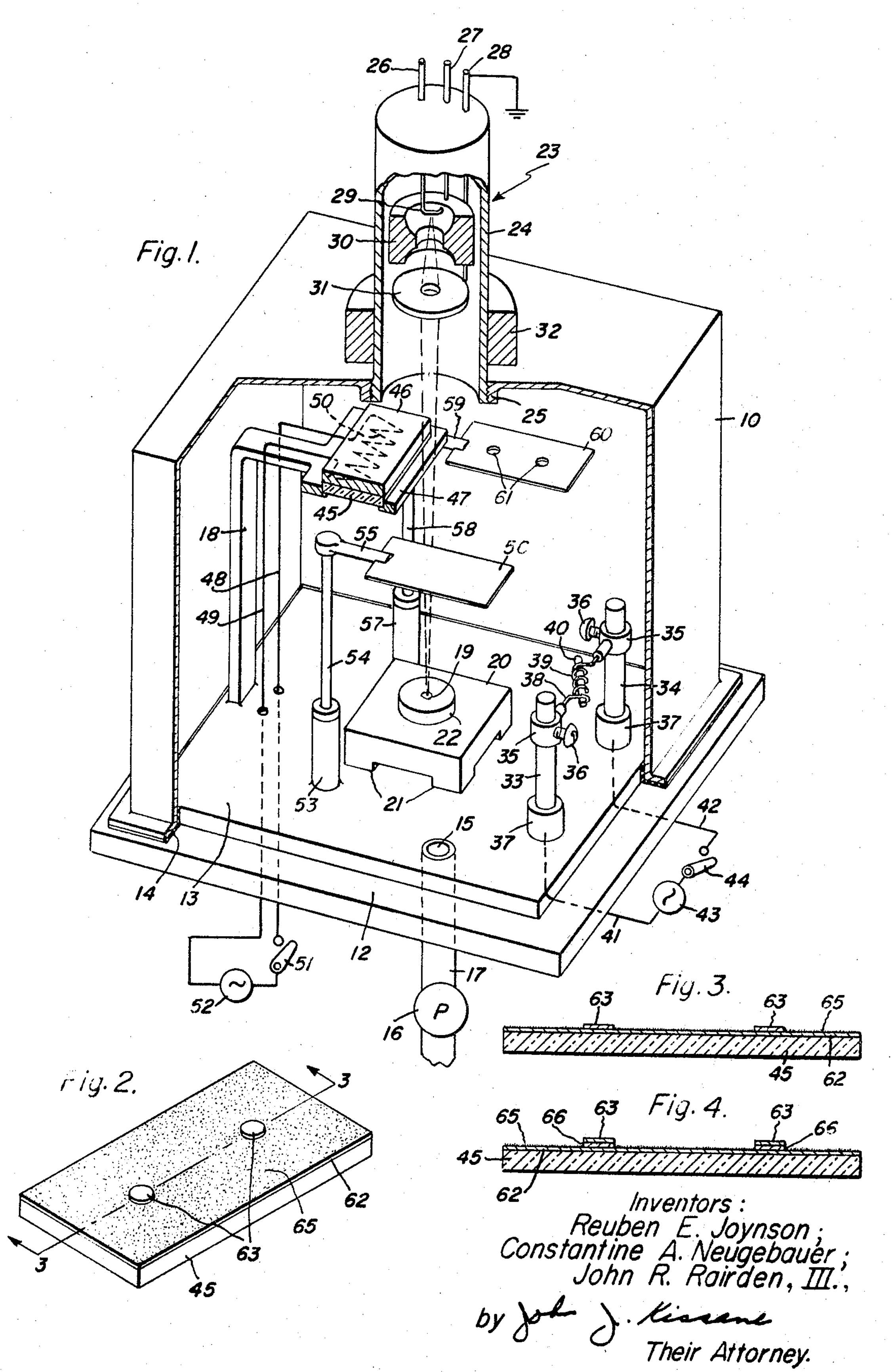

This invention relates to a method of forming superconductive contacts on a superconductive ground plane and, in particular, to the formation of superconductive contacts by the subsequent selective deposition of a superconductive metal within the identical chamber utilized in the formation of the ground plane without releasing the vacuum of the chamber between depositions.

High melting point superconductive metals, such as niobium, tantalum and their alloys, generally are ideally suited for utilization as cryotron ground plane material not only because of the fine superconducting characteristics of the metals but also because of their rapid oxidation in air to form an extremely tough, chemically inert insulating film required for cryotron operation. The oxide layer, however, inhibits the formation of superconducting connections to the ground planes as is necessary during the fabrication of high speed multiplate cryotron arrays. Thus the usual bonding techniques, such as soldering, generally are unsuccessful in making electrical contact with the underlying unoxidized metal and, when such contact is made, the junction often is not superconductive.

In order to prevent the formation of the oxide layer upon deposited films before circuitry connections have been made, the films normally are stored in liquid nitrogen and removed only immediately prior to their usage. Once the surface of a film had become oxidized by exposure to the atmosphere, it heretofore was necessary either to discard the film or to expend an inordinate amount of time and effort in obtaining superconducting contact with the underlying unoxidized film.

It is therefore an object of this invention to provide a method of depositing a high melting point superconductive metallic film to whch superconductive contact can readily be accomplished by ordinary bonding techniques.

It is also an object of this invention to provide a method of forming a superconductive film of niobium, tantalum or superconductive alloys thereof having superconductive terminals spaced at selected positions along its surface.

It is a further object of this invention to provide a method of forming a thin film for use as a superconductive ground plane by the deposition of a film of niobium, tantalum or superconducting alloys thereof and the subsequent selective condensation of a superconductive metal upon the previously deposited film without releasing the vacuum of the chamber wherein the depositions are performed.

It is also an object of this invention to provide a method of forming a superconductive contact upon an oxidized high melting point superconductive thin film of niobium, tantalum or their superconducting alloys by baking the film within a vacuum to dissolve the oxide layer and subsequently depositing a superconductive metal at selected locations along the renovated film without releasing the vacuum of the chamber wherein the baking was performed.

In the formation of a superconductive thin film having superconductive contacts according to one aspect of this invention, a first metal selected from the group consisting of niobium, tantalum and superconducting alloys thereof, a second superconductive metal and at least one substrate are positioned within a closed chamber. The pressure within the closed chamber is lowered to a range of from $1\times10^{-9}$ to $5\times10^{-5}$ mm. of mercury and the first metal is heated to at least its melting point thereby evaporating a portion of the first metal which disperses throughout the chamber. The evaporated metal condenses upon the substrate to form a superconductive film of desired thickness whereupon the application of heat to the first metal is terminated. Subsequently the second superconductive metal is evaporated and deposited at one or more selected locations atop the film without breaching the vacuum of the chamber to form a superconductive contact for the film.

If the superconductive film has already become oxidized, superconductive contact can be made with the film after the oxide layer has been removed by a process which includes positioning the oxidized superconductive film within a sealed chamber under subatmospheric pressure and the subsequent baking of the oxidized film at a sufficiently high temperature to dissolve the oxide layer. A superconductive metal then is evaporated and condensed at one or more selected locations along the film under the reduced pressure of the chamber wherein the oxidation removal was accomplished to provide a superconductive contact for the renovated film.

In order to increase the adhesion between the superconductive contact and the superconductive film, the transition between the superconductive metals can be made gradual by the codeposition of both metals on the selected contact area prior to the condensation of solely the superconductive contact metal. The alloy formed by the codeposition serves as a bond between the film and the contact to reduce the stresses produced in the metals by a variation in operational temperature during subsequent usage.

Although the method of this invention is particularly adaptable to situations wherein the superconductive contact metal forms a surface oxide which is easily penetrated to permit bonding by the usual techniques of soldering, resistance welding, pressure contacting and thermo-compression, bonding, superconductive metals which form a tough, insulating oxide film also can be utilized as contact metals without departing from the scope of this invention.

These and various other objects, features and advantages of the invention will be better understood from the following description taken in connection with the accompanying drawings in which:

FIG. 1 is a cutaway isometric view of the apparatus used in performing the method of this invention, FIG. 2 is an enlarged isometric view of a superconductive film produced by the method of this invention, FIG. 3 is a sectional view taken along lines 3—3 of FIG. 2, and FIG. 4 is a sectional view of a superconductive film formed by the method of this invention wherein an alloy of the metals serves as a bond between the film and the contacts.

The closed generally rectangular chamber 10 utilized for the evaporation and deposition of the superconducting metals during the formation of a thin film in accordance with the method of this invention is portrayed in FIG. 1. Chamber 10 is seated upon a rectangular base 11 which has a ledge 12 extending along its periphery and a raised center portion 13 protruding upwardly into the interior of the closed chamber. A gasket 14 is provided intermediate the vertical sidewalls of the chamber and the ledge to seal the interior of the chamber during operation. Forwardly positioned within the raised portion 13 of base 11 is a circular aperture 15 which communicates the interior of the chamber with vacuum pump 16 through line 17 for the evacuation of the sealed chamber.

A water cooled platform 20 is centrally positioned upon base 11 and is provided with support legs 21 which are interiorly bored to communicate the platform with an external source of flowing coolant (not shown). The superconductive metal from which the thin film will be fabricated is positioned as an ingot 22 atop the water cooled platform. Ingot 22 is a metal selected from the group consisting of niobium, tantalum and superconducting alloys thereof and is cylindrically shaped having a diameter of approximately 2 inches and a height of approximately 1 inch. Niobium is preferred for utilization in the formation of the superconductive film because of its ready availability at a reasonable cost in addition to its desirable properties. Because only a small area 19 of about 1 to 2 cms. in diameter is molten during the deposition, ingot 22 acts both as the source and as a container for the source of superconductive material.

The heat source used in the preferred method of this invention to evaporate a portion of niobium ingot 22 is a beam generated by an electron gun 23, centrally positioned atop chamber 10 in a vertical attitude with the ingot. Gun 23 includes a vertically extending neck 24 having a lower open end threadedly engaged within a tapped aperture 25 situated within the top of chamber 10. The opposite end of neck 24 remote from the chamber is sealed with prongs 26, 27 and 28 being provided to communicate diverse electrical potentials to the cathode 29, grid 30, and anode 31 of the gun, respectively. In the production of the electron beam for the evaporation of niobium ingot 22, anode 31 was grounded through prong 28 and cathode 29 was energided with a source of negative D.C. potential equal to —20,000 volts through prong 28 and cathode 29 was energized with a source applied to grid 30 through prong 27 was found to provide sufficient electron beam bombardment of the ingot to liquefy a circular area 19 approximately 2 cm. in diameter. Magnetic yoke 32 circumferentially embracing the neck of electron gun 23 functions to focus the electrons emitted from cathode 29 upon the surface of ingot 22.

A pair of vertically extending rods 33 and 34 are each provided with an adjustable arm 35 which can be locked in selected position by set screw 36. Each rod is supported in an electrically insulating sleeve 37 positioned in an aperture in raised portion 13 of base 11 and a molybdenum wire 38 extends approximately horizontally between the adjustable arms. The molybdenum wire is centrally coiled at 39 to support a globule of superconductive metal 40. Tin functions as the preferred source of superconductive material for globule 40 because of its ability to alloy with niobium, its relatively high transition temperature and the ready penetration of its oxide layer by ordinary bonding means. Although exhibiting a lower transition temperature than tin, indium also possesses favorable characteristics as a globule material for the formation of the superconductive contacts upon the ground plane. Rods 33 and 34 are connected by a pair of external leads 41 and 42, respectively, to a 5 volt, 15 ampere source of alternating current 43 through switch 44 to provide electrical energization for globule 40.

One or more substrates 45 upon which the thin superconducting film will be deposited lie within a ledge of rectangular frame 47 which is supported in an elevated position by an angularly shaped brace 18. The lower faces of the substrates are situated in a generally confronting attitude with ingot 22 and a resistance-wound auxiliary heater 46 is seated upon the substrates' faces remote from ingot 22. The base 11 of chamber 10 is apertured to permit the passage of electrical leads 48 and 49 into the chamber for energization of windings 50 embedded within the body of the resistance-wound auxiliary heater. Externally, leads 48 and 49 are connected through switch 51 to a 40 volt, 5 ampere source of alternating current 52 which can raise the temperature of substrates 45 to values in excess of 600° C. The substrates can be fabricated from any one of a variety of metallic and non-metallic materials, e.g. tungsten, stainless steel, quartz, mica, magnesium oxide, and soda lime glass.

An insulating sleeve 53 positions a pivotal rod 54 with an arm 55 being supported upon the end of the rod remote from base 11. Rod 54 can be moved from outside chamber 10 by any suitable means (not shown). A shield 56 in the form of a flat homogeneous molybdenum plate is secured at the end of arm 55 and upon rotation of rod 54, the shield can be positioned in an underlying relationship with substrates 45.

A second insulating sleeve 57 positions a pivotal rod 58 which is provided with an outwardly extending arm 59 supported thereon. Rod 58 also is rotatable by means external to the chamber. A flat molybdenum sheet 60 is secured to the end of arm 59 remote from rod 58 and upon rotation of the rod can be positioned to underlay substrates 45. Sheet 60 is provided with two apertures 61 spaced along its length which permit the selective deposition of superconducting metal upon substrates 44 when the perforated sheet is in an underlying position.

In the performance of the preferred method of this invention, ingot 22 is seated upon water cooled platform 20 and globule of tin 40 is inserted within the coils 39 of molybdenum wire 38. After the substrates 45 have been positioned within frame 47 and resistance-wound auxiliary heater 46 secured atop the substrates, the upper portion of chamber 10 is seated upon the base and the interior is evacuated by vacuum pump 16 to produce a pressure of $1\times10^{-10}$ to $5\times10^{-5}$ mm. of mercury. Voltage source 52 is applied to resistance-wound auxiliary heater 46 through closed switch 51 to preheat the substrates to a temperature of approximately 450° C. to enhance the purity of the subsequent niobium depositions. After the preheating has been accomplished pivotal rod 54 is rotated to position shield 56 in an underlying relationship with the substrates and electron gun 23 is energized through prongs 26, 27 and 28 to produce a stream of electrons from cathode 29. The electron stream is focused by yoke 32 upon an area 19 of the upper surface of ingot 22 approximately 1 to 2 cc. in diameter and a liquefication of a portion of the niobium ingot is accomplished. The niobium vapor dissipates throughout the closed chamber and provides a gettering action to reduce the oxygen content within the chamber to a minimal value. Rod 54 is then rotated to remove shield 56 from its protective position underlying the substrates and a thin niobium film is deposited. The deposition process continues until the deposited film has reached the desired thickness. Thereupon energization of electron gun 23 is terminated and ingot 22 is cooled by platform 20 to prevent any further dislodgement of the niobium atoms into the atmosphere of the closed chamber.

After completion of the deposition of the niobium film and its subsequent cooling below the melting point of tin, e.g. 231° C., pivot rod 58 is rotated so that perforated sheet 60 underlies the deposited film and switch 44 is closed to energize molybdenum wire 38. The current flowing through coils 39 of the molybdenum wire heats the globule of tin 40 to a temperature sufficient to produce partial evaporation of the tin. The evaporated tin disperses throughout the closed chamber and is deposited on substrates 45 only at those locations which overlie apertures 61 within sheet 60. Upon completion of the deposition of the tin contacts, switch 44 is opened to de-energize molybdenum wire 38 thereby preventing any further dispersion of the tin throughout the chamber.

When the interior of the chamber has cooled sufficiently to permit the reentry of atmospheric gases, air is admitted through aperture 15 in base 11, and the upper portion of chamber 10 can be removed. Because the tin contacts were deposited in a chamber which had been completely purged of oxygen by the prior deposition of the niobium film, there is no niobium oxide formed between the film and the deposited contacts. The atmospheric gases, however, form a tough, chemically inert electrically insulating film over the entire uncovered surface of the niobium. The surface oxidation formed upon the tin however is easily penetrated to permit bonding by the usual techniques of soldering, resistance welding, pressure contacting, and thermo-compression bonding.

In the renovation of a previously oxidized film of niobium, tantalum or their superconducting alloys according to this invention, the oxidized film is secured in position within frame 47 underlying auxiliary heater 46 in place of substrates 45 and a globule of tin 40 is inserted within coils 39 of molybdenum wire 38. The upper portion of chamber 10 then is seated upon base 11 and the interior is evacuated by vacuum pump 16 to produce a pressure of $1\times10^{-10}$ to $5\times10^{-5}$ mm. of mercury within the closed chamber. Resistance-wound auxiliary heater 46 is energized by voltage source 52 through closed switch 51 to raise the temperature of the oxidized thin film to approximately 350° C. thereby dissolving the oxide layer in the underlying metal.

After the oxidized film has been heated for a sufficient period to dissolve the exterior oxide layer and subsequently cooled below 231° C., pivot rod 58 is rotated to position sheet 60 in an underlying relationship with the renovated film and switch 44 is closed to energize molybdenum wire 38. The current flowing through coils 39 of the molybdenum wire heats the globule of tin 40 to a temperature sufficient to produce partial evaporation of the tin which disperses throughout the closed chamber and is deposited on the renovated film only at those locations overlying apertures 61 within sheet 60. Upon completion of the deposition of the tin contacts, switch 44 is opened to de-energize the molybdenum wire thereby preventing any further dissipation of the tin. The subsequently deposited tin therefore contacts the deoxidized niobium surface free from any oxide impurity between the contacting faces.

When the interior of the chamber has cooled sufficiently to permit the reentry of atmospheric gases, air is admitted gradually through central aperture 15 in base 11, and the upper portion of chamber 10 can be removed. The admission of atmospheric gases to the chamber again forms a tough, chemically inert, electrically insulating oxide over the entire uncovered surface of the niobium. The tin contacts provide usperconducting connection to the underlying film which is oxidized except at the contact locations.

In utilizations where niobium possesses desirable characteristics for the superconductive contact material, a high purity film is obtained in the manner previously described. After formation of the pure film, electron gun 23 is energized so that a portion of ingot 22 is molten and evaporates niobium into the atmosphere of the chamber. Rod 58 then is rotated to position perforated sheet 60 in an underlying relationship with the film and the evaporation is continued until contacts of the desired thickness have been deposited.

A thin film of superconductive metal having superconductive contacts formed by the methods of this invention is shown in enlarged form in FIGS. 2 and 3. As will be noticed particularly with reference to FIG. 3, the upper exposed surface of niobium film 62 reacts with the atmospheric gases to form a thick insulating oxide 65 over its entire upper surface. Those portions of the niobium which are covered by the superconducting tin contacts 63 remain unoxidized. Because the surface tin oxide is easily penetrable, external bonding to the tin surface can be accomplished by utilizing one of the well known bonding techniques to accomplish the union.

In order to increase the adhesion between the niobium and the tin, the transition between the superconductive metals can be made gradual by the codeposition of both metals upon the selected contact areas prior to the deposition of the tin alone. A film formed by this method is shown in FIG. 4. The alloy 66 formed between niobium film 62 and tin contact 63 by the codeposition of the metals serves as a bond to reduce the stresses produced between the nobium and the tin by variation in the operational temperatures of the film during subsequent usage.

In the formation of the film having the alloy layer intermediate the niobium and the tin superconducting contact, a high purity niobium film is obtained in the manners described previously. Electron gun 23 is energized after formation of the pure film so that a portion of ingot 22 is molten and evaporates niobium into the atmosphere of the chamber. Rod 58 is rotated to the position perforated sheet 60 in an underlying relationship with substrates 45, and switch 44 is closed to energize molybdenum wire 38 thereby evaporating a portion of the globule of tin 40 into the chamber. The niobium and the tin are codeposited upon the face of the niobium thin film underlying the apertures within sheet 60 in the form of an alloy 66 of the metals. Only after the required thickness of the alloy has been deposited on the film is electron gun 23 de-energized to terminate any further dispersion of the niobium into the atmosphere of the chamber. Because molybdenum wire 38 continues to be energized through switch 44, the tin globule 40 continues to evaporate into the atmosphere and be deposited atop the alloy. The deposition continues until the desired layer of superconducting tin 63 for the contact has been achieved.

Although layer 66 has been described as an alloy of niobium and tin it will be obvious that under certain deposition conditions the pure elements of niobium and tin may be present in addition to any compounds formed between these elements. It has been found that the characteristics of the compound formed by the codeposition of niobum and tin onto a substrate at 450° C. are superconducting at 4.2° K. and therefore suitable for use as an intermediate layer for contact areas in cryotron arrays.

While several examples of this invention have been shown and described, it will be apparent to those skilled in the art that many changes may be made without departing from this invention in its broader aspects; and therefore the appended claims are intended to cover all such changes and modifications as fall within the true spirit and scope of this invention.

What we claim as new and desire to secure by Letters Patent of the United States is:

1. A method of forming an oxidation-resistant superconductive contact upon a thin film which comprises positioning at least one substrate within a chamber, evacuating said chamber to a subatmospheric pressure between $5\times10^{-5}$ and $1\times10^{-10}$ mm. of mercury, positioning a member of a superconductive metal chosen from the group consisting of niobium, tantalum and alloys thereof within said chamber, situating a second superconductive metal within said chamber, heating said member to at least its melting point thereby evaporating a portion of said metal, condensing said evaporated metal on said substrate to form a film of desired thickness, and subsequentially depositing said second superconductive metal at selected locations along said film without breaching the vacuum of the chamber to form a superconductive contact for the film, said second superconductive metal electrically contacting said underlying film and being characterized by a surface easily penetrated to form an external electrical bond relative to the penetrability of said first superconductive film surface upon exposure of said film with selective contacts to air.

2. A method for forming a superconductive contact upon a thin film according to claim 1 including the codeposition of both superconductive metals upon the selected contact area prior to the condensation of solely said second metal upon the contact area.

3. A method of forming a superconductive contact upon a thin film according to claim 1 wherein said member is niobium and said second superconductive metal is tin.

4. In a method of forming a high purity superconductive thin film surface by the application of heat to a superconductive metal chosen from the group composed of niobium, tantalum and alloys thereof at pressures below $5 \times 10^{-5}$ mm. of mercury within a closed chamber, the improvement which comprises the subsequent evaporation and condensation of a superconductive contact metal at selected locations upon said superconductive film without alteration in the environmental conditions within the closed chamber after formation of the high purity film, said superconductive contact metal electrically contacting said underlying film and being characterized by a surface easily penetrated to form an external electrical bond relative to the penetrability of said superconductive film surface upon exposure of said film with selective contacts to air.

5. A method for forming a superconductive contact upon a thin film according to claim 4 including the codeposition of both superconductive metals upon the selected contact area prior to the condensation of solely the contact metal upon the contact area.

6. A method of forming superconductive contacts upon the oxidizesd surface of a high melting point superconductive thin metallic film chosen from the group composed of niobium, tantalum and alloys thereof which comprises positioning said oxidized superconductive film within a sealed chamber, situating a superconductive metal within said chamber, evacuating said chamber to a pressure below $5 \times 10^{-5}$ mm. of mercury, heating said oxidized superconductive film to a temperature above 350° C. to dissolve the oxide layer, and subsequently evaporating and condensing said superconductive metal at selected locations along said film under the subatmospheric pressure of the chamber to form a superconductive contact upon the film, said superconductive contact metal electrically contacting said film and being characterized by a surface easily penetrated to form an external electrical bond relative to the penetrability of said superconductive film surface upon exposure of said film with selective contacts to air.

References Cited

UNITED STATES PATENTS

| | | | |
|---|---|---|---|
| 3,436,256 | 4/1969 | Neugebauer | 117—107 X |
| 3,328,200 | 1/1967 | Neugebauer | 117—107 X |
| 3,402,073 | 9/1968 | Pierce et al. | 117—212 |
| 3,268,362 | 8/1966 | Hanak et al. | 117—227 |
| 3,230,109 | 1/1966 | Domaleski | 117—38 X |
| 3,091,556 | 5/1963 | Behrndt et al. | 117—217 X |
| 3,047,424 | 7/1962 | Suchoff | 117—217 X |
| 3,055,775 | 9/1962 | Crittenden et al. | 117—217 X |

ALFRED L. LEAVITT, Primary Examiner

A. GRINALDI, Assistant Examiner

U.S. Cl. X.R.

29—599; 117—107, 217; 317—234